United States Patent [19]

Dyment et al.

[11] 4,325,034
[45] Apr. 13, 1982

[54] SEMICONDUCTOR LASERS WITH INTEGRALLY FORMED LIGHT EMITTING DIODES

[75] Inventors: John C. Dyment, Kanata; Christopher M. Look, Nepean; Kiu-Chi D. Chik, Ottawa, all of Canada

[73] Assignee: Northern Telecom Limited, Montreal, Canada

[21] Appl. No.: 121,172

[22] Filed: Feb. 13, 1980

[51] Int. Cl.³ .............................................. H01S 3/19
[52] U.S. Cl. ...................................... 372/50; 357/17; 357/19
[58] Field of Search ...................... 331/94.5 H, 94.5 S; 357/17–19

[56] References Cited

U.S. PATENT DOCUMENTS

| | | | |
|---|---|---|---|
| 3,702,975 | 11/1972 | Miller | 331/94.5 H |
| 4,217,561 | 8/1980 | Scifres et al. | 331/94.5 H |
| 4,219,785 | 8/1980 | Scifres et al. | 331/94.5 H |

Primary Examiner—James W. Davie
Attorney, Agent, or Firm—Stuart L. Wilkinson

[57] ABSTRACT

Semiconductor lasers exhibit transient relaxation oscillation on start-up and specific lasers often exhibit sustained spontaneous pulsations caused probably by crystalline defects. These fluctuations are suppressed in a laser having an integrally formed light emitting diode (LED) which generates spontaneous light which is coupled into the laser by virtue of the close proximity of the laser and the light emitting diode.

5 Claims, 1 Drawing Figure

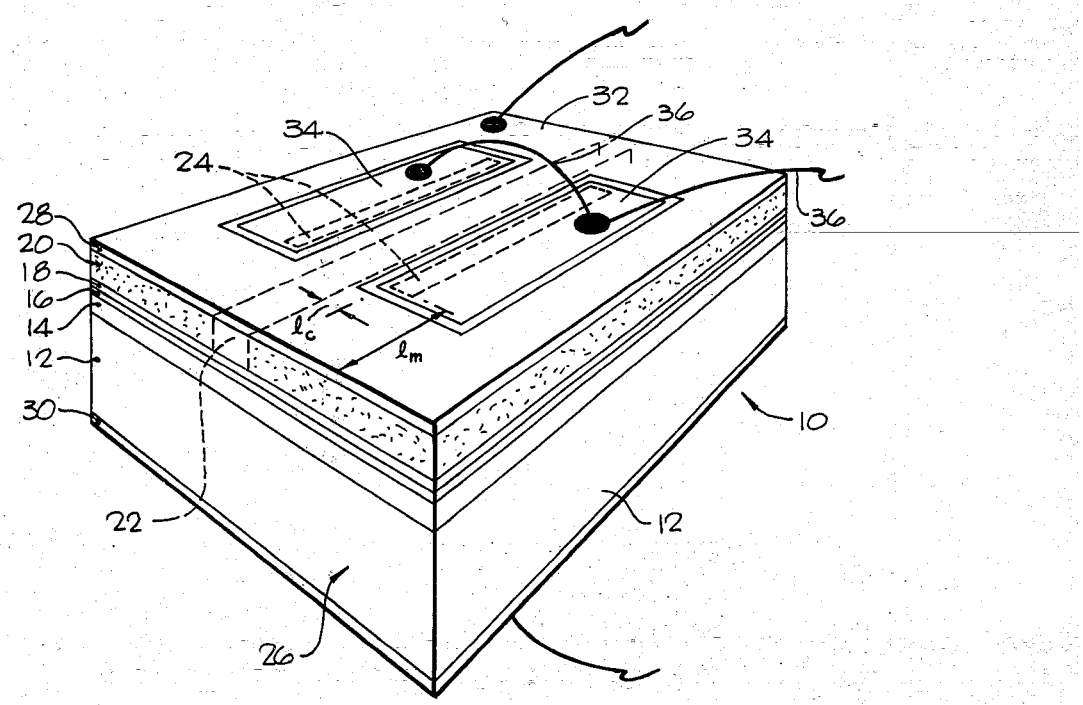

SEMICONDUCTOR LASERS WITH INTEGRALLY FORMED LIGHT EMITTING DIODES

This invention relates to a semiconductor laser device which is adapted for the elimination of high frequency self-pulsations which are an undesirable characteristic of some semiconductor lasers.

BACKGROUND OF THE INVENTION

Semiconductor injection lasers are greatly suited to high data rate fiber optic transmission systems since they can be modulated in the GHz range and have a narrow, well-defined output bandwidth.

Two difficulties of operating semiconductor lasers at high modulation rates are that (i) transient relaxation oscillations are generated when the laser is first switched on and (ii) in certain circumstances which have not yet been fully determined, semiconductor lasers exhibit sustained pulsations within a range of bias conditions. In the former case, the oscillation frequency is of the order of 1 GHz and the laser reaches a steady state within a few nanoseconds. In the latter case, the pulsations, which have a frequency of from 0.2 to 2 GHz, are believed to derive from crystalline defects including those defects which develop during laser operation. This explains why some lasers do not exhibit sustained pulsations at all, while others are subject to pulsations only as the devices age.

Chinone, et al (Applied Physics Letters, Vol. 33, Page 12, 15 December 1978) show that relaxation oscillations and sustained pulsations in a semiconductor laser output can be suppressed by feeding back into the laser resonant cavity light reflected from an external mirror located close to the laser output facet. Chinone et al demonstrate an arrangement for achieving oscillation suppression which uses a laser, a converging lens separate from the laser and a plane mirror separate from the lens. Light from the laser is rendered parallel at the converging lens and is transmitted through an air gap of the order of 1 cm. in length before being reflected back through the lens to the laser.

Obviously, although the method and device disclosed by Chinone and later, in as modified form, by Kobayishi (U.S. Pat. No. 4,079,339) may be quite satisfactory to the extent to which self-pulsations are quenched, it would be preferable if quenching took place within the semiconductor chip itself without recourse to an external reflector and light collimating means, the latter being both bulky and tedious to adjust.

SUMMARY OF THE INVENTION

It its broadest aspect the present invention proposes a semiconductor laser device comprising a semiconductor chip having formed therein a conventional semiconductor laser structure but in which chip, at a location spaced from a lasing region, spontaneous emission is generated, such emission being coupled into the lasing region.

The spontaneous emission can be generated by LED structures formed on each side of the lasing region. The LED's can be located sufficiently close to the lasing region that light couples through the agency of the intervening portion of the active layer. In a practical structure, top contacts of the laser and LED's can be deposited as a single overall layer and then photodefined to produce separate contacts while the laser and LED's can share a common bottom contact. The LED's can be distributed along both sides of a laser and can be individually biased in order to influence the efficiency of lasing action differentially along the length of the laser.

BRIEF DESCRIPTION OF THE DRAWING

An embodiment of the invention will now be described by way of example with reference to the accompanying drawing which is a schematic perspective view of a laser device according to the invention.

DETAILED DESCRIPTION OF THE DRAWING

Referring to the drawing in detail, a double heterostructure laser device 10 comprises a n-type GaAs substrate 12 on which are formed a bottom confining layer 14 of n-type GaAlAs about 1.5 microns thick, an active layer 16 of p-type GaAlAs about 0.2 microns thick, a top confining layer 18 of p-type GaAlAs about 1.5 microns thick and a capping layer 20 of p-type GaAs about 0.8 microns thick. The capping layer 20 is rendered highly resistive by high energy proton bombardment except at a striped region 22 and at rectangular regions 24 flanking the striped region. The distance between region 22 and each of the regions 24, $l_c$ is about 5 $\mu$m while their lengths are respectively 200 and 130 $\mu$m.

Contacts to the double heterostructure laser are vacuum deposited as a gold layer 28 on the capping layer 20 and a layer 30 of gold-germanium about 1000 Å thick on the undersurface of substrate 12. The top contact area is photodefined into a laser contact pad 32 and contact pads 34 for a pair of LED's. The distance between the contact pad 32 and each of the pads 34 is kept as small as possible—about 5 $\mu$m. This permits the width of the region of the contact pad 32 immediately over the lasing cavity to be maximized so minimizing the resistance to current injection at the laser top contact. The contact pads 34 overlap the low resistivity regions 24 which are set in from cleaved facets 26 by about 50 $\mu$m.

Opposed end facets 26 of the DH laser device are cleaved to form a cavity resonator for sustaining stimulated photon emission in the active layer 16 when the p-n junction between the active layer 16 and the first confining layer 14 is forward biased.

In operation, when current is passed through the DH laser via contacts 32 and 30, current carries injected into the active layer 16 excite atoms into high energy states, active layer 16 thus introducing excess carriers into the conduction and valence bands. At sufficiently high current drive levels, the carrier densities are sufficiently in excess of their thermal equilibrium values that the region can be said to have its population inverted.

Where this occurs, the carriers are stimulated by the optical (photon) field to recombine radiatively adding their photon of energy to the optical field. The photon emission propagates through the active layer 16 causing adjacent carriers to undergo the same energy change, the light obtained being coherent and corresponding to that change. The confining layers 14 and 18 and the cleaved facets 26 define a resonant cavity within which this stimulated process takes place. The end facets 26 act as partially reflecting mirrors allowing some fraction of this light to leave the cavity and propagate in a direction normal to the facets.

As previously stated, semicondutor lasers show transient relaxation oscillations from start-up until they reach a steady state output—a period of a few nanoseconds. In addition to this, and depending, it is thought, on the laser crystalline integrity, certain lasers exhibit a sustained spontaneous pulsation in the frequency range 0.2 to 2 GHz, the frequency varying with the current bias applied.

Briefly the high frequency pulsations are believed to derive from the presence of saturable absorbers or traps at defect locations in the semiconductor chip. In a pulse cycle, current to the laser produces photons which initially fill the traps. Until the traps have absorbed a sufficiently large number of photons, the cavity loss will be high and lasing will be prevented. Meanwhile, the number of injected carriers has increased to a very high level. When the traps are mostly full, the cavity loss decreases which suddenly induces an excess net gain in the laser cavity and an intense burst of stimulated emission occurs. Because the injected current cannot maintain the high excess gain in the laser, the photon density drops while the traps relax back to their unexcited states. The cycle is then repeated, to create a series of sharp optical pulses known as pulsations.

Both of these oscillatory fluctuations are at least partially suppressed by spontaneous light emission generated within the LED's 35 and coupled through an intervening part of the active layer 16 into the laser resonant cavity.

As shown in the Figure, a common bias lead 36 ensures that the two LED's 35 receive the same bias current. However this need not be the case. Thus the LED's 35 could be individually addressed with different bias currents if, for example, the performance characteristics of the LED's or their spacing from the laser should be different from one another. Compensation can thus be introduced to equalize the light coupling into the two sides of the laser. Alternatively it may be advantageous to have a different light input from one LED compared to that from the other LED.

Indeed, consistency of the lasing efficiency along the length of the laser can be influenced by having a series of distributed LED's extending along each side of the resonant cavity. By differentially biasing the LED's, a higher level of spontaneous light emission can be coupled into the laser at a location where it is lasing weakly than at a location undergoing strong lasing action.

Spontaneous light emission takes place in all directions from that part of the active layer 16 in which LED light generation occurs. The LED active regions are therefore spaced a distance, $l_m$, of about 50 $\mu$m from the cleaved facets 26 so that spontaneous LED light emission does not reduce the extinction ratio of the laser which might deleteriously affect the laser if used in a digital system.

Although the invention is described in terms of a double heterostructure laser, it will be clear to those skilled in the semiconductor laser art that single heterostructure or homojunction laser devices can be fabricated in a similar manner.

In addition, although, in the example described, spontaneous light generated in the active layer reaches the lasing region by penetrating through an intervening portion of the laser device chip, the spontaneous light could be guided to the lasing region by means of a waveguide layer. Finally although it is convenient to generate the spontaneous light emission and lasing light in the same active layer, there are advantages to generating light in a spatially separated active layer since with appropriate choice of chemical composition of the device layers, active layers with different emission lines can be achieved. Quenching of the self pulsations has been found to be more effective if a spontaneous light of shorter wavelength than the lasing light is injected into the lasing region.

What is claimed is:

1. A semiconductor device comprising a laser and a light emitting diode having a common pn junction, the laser and the light emitting diode having top and bottom contacts for directing current across the pn junction, to generate light at respective active regions thereof, the device having opposed planar reflecting facets defining a resonant cavity of the laser, the laser activity region extending to the opposed facets, the light emitting diode active region being spaced from the facets but located close to the laser resonant cavity whereby spontaneous emission generated at the light emitting diode active region and directed towards the facets is absorbed by the chip material and spontaneous emission generated at the light emitting diode active region and directed towards the resonant cavity penetrates thereto.

2. A semiconductor laser device as claimed in claim 1 in which a pair of identical such light emitting diodes flank the lasing region to form a symmetrical structure.

3. A laser device as claimed in claim 1 in which the light emitting diode and the laser are formed on a substrate, on the bottom surface of which substrate is formed a common bottom contact for the laser and the light emitting diode.

4. A laser device as claimed in claim 3 the device having a capping layer of high resistivity except at predetermined regions, which regions direct current to the laser and to the light emitting diode via contacts formed on a top surface of the capping layer.

5. A semiconductor device as claimed in claim 1 in which the top contacts for the laser and said the light emitting diode are coplanar by virtue of their being formed as a single layer, which layer is subsequently photodefined.

* * * * *